(12) United States Patent
Seddon

(10) Patent No.: US 11,289,358 B2
(45) Date of Patent: Mar. 29, 2022

(54) WAFER THINNING SYSTEMS AND RELATED METHODS

(71) Applicant: SEMICONDUCTOR COMPONENTS INDUSTRIES, LLC, Phoenix, AZ (US)

(72) Inventor: Michael J. Seddon, Gilbert, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 44 days.

(21) Appl. No.: 16/872,971

(22) Filed: May 12, 2020

(65) Prior Publication Data
US 2020/0273738 A1 Aug. 27, 2020

Related U.S. Application Data

(62) Division of application No. 15/964,464, filed on Apr. 27, 2018, now Pat. No. 10,685,863.

(51) Int. Cl.
*H01L 21/68* (2006.01)
*H01L 21/683* (2006.01)
*B24B 7/22* (2006.01)
*H01L 25/00* (2006.01)

(52) U.S. Cl.
CPC .......... *H01L 21/6835* (2013.01); *B24B 7/228* (2013.01); *H01L 25/50* (2013.01); *H01L 2221/6834* (2013.01)

(58) Field of Classification Search
CPC .............. H01L 21/6835; H01L 25/50; H01L 2221/6834; H01L 2221/68327; H01L 21/0475; B24B 7/228; B24B 37/10; B24B 1/04

USPC .......................................................... 438/460
See application file for complete search history.

(56) References Cited

U.S. PATENT DOCUMENTS

| | | | |
|---|---|---|---|
| 5,632,667 | A | 5/1997 | Earl |
| 5,893,483 | A | 11/1999 | Tarumizu |
| 5,986,231 | A | 11/1999 | Okuya |
| 6,071,047 | A | 6/2000 | Nakai |
| 2001/0004631 | A1 | 6/2001 | Enomoto |
| 2002/0145940 | A1 | 10/2002 | Terentiev |
| 2004/0082149 | A1 | 4/2004 | Sakaguchi |
| 2005/0032469 | A1 | 2/2005 | Duescher |
| 2005/0142815 | A1 | 6/2005 | Miyazaki |
| 2006/0109591 | A1 | 5/2006 | Ranjan |

(Continued)

OTHER PUBLICATIONS

Disco Corporation, "Fully Automatic In-Feed Surface Grinder DFG8540/8560," available at https://www.disco.co.jp/eg/products/catalog/pdf/dfg8540.pdf, last visited Apr. 25, 2018.

(Continued)

*Primary Examiner* — Mohammad M Hoque
(74) *Attorney, Agent, or Firm* — Adam R. Stephenson, Ltd.

(57) ABSTRACT

Implementations of systems for thinning a semiconductor substrate may include: a substrate chuck configured to receive a semiconductor substrate for thinning, a spindle, a grinding wheel coupled to the spindle, and a water medium configured to be in contact with the semiconductor substrate during thinning. An ultrasonic energy source may be directly coupled to the substrate chuck, the spindle, the grinding wheel, the water medium, or any combination thereof.

15 Claims, 2 Drawing Sheets

(56) References Cited

U.S. PATENT DOCUMENTS

| | | |
|---|---|---|
| 2006/0249398 A1 | 11/2006 | Becker |
| 2009/0029627 A1 | 1/2009 | Ejimatani |
| 2010/0311225 A1 | 12/2010 | Sekiya |
| 2011/0054969 A1 | 3/2011 | Barreiro |
| 2011/0065066 A1 | 3/2011 | Segawa |
| 2012/0028543 A1 | 2/2012 | Tano |
| 2012/0225609 A1 | 9/2012 | Yanase |
| 2012/0238185 A1 | 9/2012 | Yanase |
| 2012/0315104 A1 | 12/2012 | Tagashira |
| 2013/0114090 A1 | 5/2013 | Schraub |
| 2013/0316194 A1 | 11/2013 | Isono |
| 2014/0157610 A1 | 6/2014 | Garvey |
| 2014/0202491 A1 | 7/2014 | Vogtmann |
| 2015/0027227 A1 | 1/2015 | Masada |
| 2015/0158137 A1 | 6/2015 | Mori |
| 2015/0298231 A1 | 10/2015 | Mraz |
| 2017/0053829 A1 | 2/2017 | Hirata |
| 2017/0053830 A1 | 2/2017 | Haimoto |
| 2017/0151627 A1 | 6/2017 | Hirata |
| 2017/0207108 A1 | 7/2017 | Choi |
| 2017/0271208 A1 | 9/2017 | Koshimizu |
| 2017/0301549 A1* | 10/2017 | Suzuki ................. B23K 26/402 |
| 2018/0079046 A1* | 3/2018 | Qiu ......................... B24B 7/228 |

OTHER PUBLICATIONS

Kanegsberg et al., "Ultrasonics vs. Megasonics," Solid State Technology, available at http://electroiq.com/blog/2002/07/ultrasonics-vs-megasonics/, Jul. 2002, last visited Apr. 25, 2018.

* cited by examiner

WAFER THINNING SYSTEMS AND RELATED METHODS

CROSS REFERENCE TO RELATED APPLICATIONS

This application is a divisional application of the earlier U.S. Utility patent application to Michael J. Seddon entitled "Wafer Thinning Systems and Related Methods," application Ser. No. 15/964,464, filed Apr. 27, 2018, now pending, the disclosure of which is hereby incorporated entirely herein by reference.

BACKGROUND

1. Technical Field

Aspects of this document relate generally to systems and methods for thinning semiconductor substrates, such as wafers.

2. Background

Semiconductor materials are used as substrates in processes for forming semiconductor devices. Often the semiconductor substrate takes the form of a wafer separated from a boule or other bulk body of the semiconductor material, often through sawing. Semiconductor substrates can be single crystal, polycrystalline, or amorphous in internal structure.

SUMMARY

Implementations of systems for thinning a semiconductor substrate may include: a substrate chuck configured to receive a semiconductor substrate for thinning, a spindle, a grinding wheel coupled to the spindle, and a water medium configured to be in contact with the semiconductor substrate during thinning. An ultrasonic energy source may be directly coupled to the substrate chuck, the spindle, the grinding wheel, the water medium, or any combination thereof.

Implementations of systems for thinning a semiconductor substrate may include one, all, or any of the following:

The semiconductor substrate may include silicon carbide.

The grinding wheel may include diamond.

The ultrasonic energy source may emit sonic energy between 20 kHz to 3 GHz.

The system may further include at least a second substrate chuck, at least a second spindle, at least a second ultrasonic energy source, or any combination thereof.

Implementations of a system for thinning a semiconductor substrate may include a substrate chuck configured to receive a semiconductor substrate for thinning, a spindle with a grinding wheel coupled thereto, and a water medium configured to contact at least a portion of the substrate chuck and at least a portion of the grinding wheel. An ultrasonic energy source may be applied to the substrate chuck, the spindle, the grinding wheel, the water medium, or any combination thereof during the thinning of the semiconductor substrate.

Implementations of systems for thinning a semiconductor substrate may include one, all, or any of the following:

The semiconductor substrate may include silicon carbide.

The grinding wheel may include diamond.

The ultrasonic energy source may emit sonic energy between 20 kHz to 3 GHz.

The system may include at least a second substrate chuck, at least a second spindle, at least a second ultrasonic energy source, or any combination thereof.

Implementations of systems for thinning a semiconductor substrate may employ implementations of a method of semiconductor substrate thinning. The method may include coupling a semiconductor substrate with a substrate chuck, coupling a grinding wheel with a spindle, and contacting a water medium with the semiconductor substrate and with at least a portion of the substrate chuck and with at least a portion of the grinding wheel. The method may include rotating the grinding wheel, the substrate chuck, or both the grinding wheel and the substrate chuck while thinning the semiconductor substrate while applying an ultrasonic energy source to the substrate chuck, the spindle, the grinding wheel, the water medium, or any combination thereof.

Implementations of a method of semiconductor substrate thinning may include one, all, or any of the following:

The method may include increasing a thinning rate of the semiconductor substrate through the ultrasonic energy source.

The semiconductor substrate may include silicon carbide.

The grinding wheel may include diamond.

The ultrasonic energy source may emit sonic energy between 20 kHz to 30 GHz.

The method may further include decreasing a wearing rate of the grinding wheel through the ultrasonic energy source.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended semiconductor substrate thinning systems and related methods will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such semiconductor substrate thinning systems, and implementing components and methods, consistent with the intended operation and methods.

A wide variety of semiconductor substrate types exist and are used in the process of manufacturing semiconductor devices. Non-limiting examples of semiconductor substrates that may be processed using the principles disclosed in this document include single crystal silicon, silicon dioxide, glass, silicon-on-insulator, gallium arsenide, sapphire, ruby, silicon carbide, polycrystalline or amorphous forms of any of the foregoing, and any other substrate type useful for constructing semiconductor devices. In this document the term "wafer" is also used along with "substrate" as a wafer is a common type of substrate, but not an exclusive term that is used to refer to all semiconductor substrate types. The various semiconductor substrate types disclosed in this document may be, by non-limiting example, round, rounded, square, rectangular, or any other closed shape in various implementations.

Figure 1:
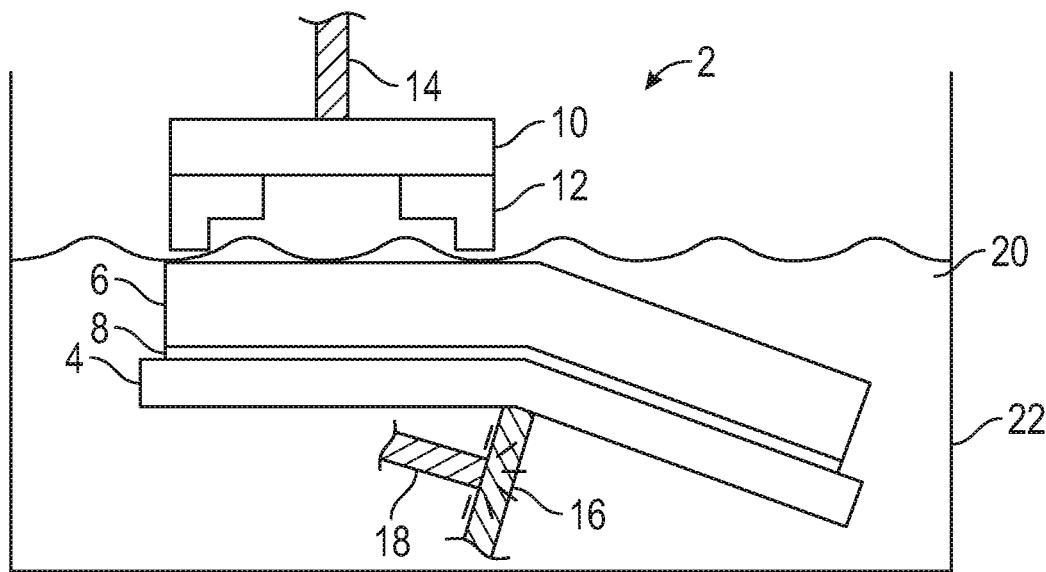
FIG. 1 is a side cross sectional view of a first implementation of a semiconductor substrate thinning system.

Referring to FIG. 1, a first implementation of a semiconductor substrate (substrate) thinning system 2 is illustrated in cross sectional view. As illustrated, a substrate chuck 4 has a semiconductor substrate 6 coupled thereto. In the implementation illustrated in FIG. 1, the substrate 6 is a finished wafer with a device layer 8 formed thereon and the substrate 6 is coupled to the substrate chuck 4 on the device layer 8 side of the wafer. In various implementations, other protective layers may be placed over the device layer 8 before it is coupled to the substrate chuck 4, such as, by non-limiting example, backgrinding tape, a spin coated film, or other protective layer. Backgrinding tape may not be used for substrates which do not have a device layer thereon. The substrate 6 is held to the substrate chuck 4 through use of vacuum applied to the various pores/areas in chuck 4 which draw air (and the substrate) against the substrate chuck 4. As illustrated, the substrate chuck 4 may be larger than the substrate 6 itself to aid in supporting the substrate 6 during the grinding process. Also, a vacuum area of the substrate chuck 4 may be designed to be slightly smaller than the size of the substrate 6 so that the wafer can seal the vacuum area to prevent water or other liquids from entering the vacuum of the chuck (particularly where the substrate chuck 4 is a porous chuck). Above the substrate 6 is a grinding wheel 10 with a plurality of teeth 12 affixed thereto which is coupled with a spindle 14. The spindle 14 is designed to allow the grinding wheel 10 to rotate relative to the substrate 6 while the plurality of teeth 12 contact and abrade the non-device side (back side) of the substrate 6. As illustrated, a spindle 16 may also be coupled to the substrate chuck 4 in some implementations, allowing the substrate chuck 4 to independently rotate relative to the grinding wheel 10. The grinding wheel 10 typically is lowered down onto the substrate 6 using a lowering system after the substrate 6 has been placed on the substrate chuck 4.

In various implementations of thinning systems disclosed in this document, the grinding wheel may rotate against the substrate, the substrate may rotate against the grinding wheel, or both the grinding wheel and the substrate may rotate simultaneously. Where simultaneous rotation occurs, the substrate may be rotated counter to a direction of the rotation of the rotation of the grinding wheel, or in the same direction of rotation as that of the grinding wheel [at different speed(s)]. Also in various implementations, the grinding wheel may move in various rotational patterns relative to the substrate to allow the teeth to evenly contact and abrade the material of the substrate (elliptically, eccentrically, circularly, etc.) depending on the pattern of teeth on the grinding wheel, the size of the substrate, and the size of the grinding wheel. In many implementations, however, the grinding wheel may rotate in a stationary location and the rotation of the substrate chuck along with the greater size of the substrate chuck and semiconductor substrate relative to the grinding wheel permits the grinding wheel to grind the entire surface of the wafer. As illustrated, the substrate chuck may hold the wafer at a non-flat angle across the top of the substrate chuck to facilitate grinding using the grinding wheel.

As illustrated in in FIG. 1, an ultrasonic energy source 18 is coupled with the substrate chuck 4. The structure and method of coupling is designed to allow the ultrasonic energy to extend throughout the structure of the chuck 4 and thus transfer the ultrasonic energy to the substrate 6 itself. In various implementations this is done through coupling the ultrasonic energy source 18 with the spindle 16 of the substrate chuck 4 itself. During the thinning operation, the interaction of the ultrasonic energy of the substrate with the teeth 12 of the grinding wheel 10 results in an enhancement of the breakdown of the microscopic and/or bulk material of the substrate 6 and thus increases the thinning rate and/or increases the life of the grinding wheel 10 itself. In various implementations, the use of the ultrasonic energy source 18 may also assist with removal of particulates generated during the thinning process and transferring them to a water medium 20 that contacts the substrate 6 and at least partially covers a portion of the substrate chuck 4 and/or the grinding wheel 10. In FIG. 1 the water-containing (water) medium 20 is illustrated as being confined in a vessel 20 that surrounds the thinning apparatus; however, in many implementations, the water medium 20 may cover the substrate 6 and the portions of the substrate chuck 4 and/or grinding wheel 10 through being actively flowed or sprayed onto/over these components during the thinning process. In such implementations, the spent water medium 20 may be collected below the various components while fresh water medium 20 is flowed/sprayed onto/over the components during operation of the system 2. In various implementations, other components may be added to the water medium to aid in the thinning process, such as, by non-limiting example, surfactants, etchants, anticorrosives, and other components designed to assist in the thinning process and/or preserve the components of the system itself.

While in the various system implementations illustrated herein in FIGS. 1-4 the substrate chuck is located below the grinding wheel, in other implementations, this arrangement may be reversed so that the grinding wheel is located below the substrate chuck. Furthermore, the relative dimensions of the grinding wheel to the substrate may differ from the proportions illustrated in the figures, for the grinding wheel may be larger, smaller, or the same size as the substrate. The same relative dimensions for the substrate chuck apply, as the substrate chuck may be larger, smaller, or the same size as the substrate in various implementations as well. Also, in various system implementations, more than one substrate chuck, grinding wheel, spindle, or ultrasonic energy source may be employed in a single system implementation. In some implementations, the thinning system may include multiple simultaneously operating grinding wheels processing multiple substrates at the same time; in other implementations, a single substrate may be sequentially processed using multiple grinding wheels while coupled with a single substrate chuck. In other implementations, the single substrate may be processed through multiple substrate chucks as it is processed by multiple grinding wheels. Many different configurations of substrate chucks, grinding wheels, spindles, and ultrasonic energy sources may be developed using the principles disclosed herein.

Figure 2:
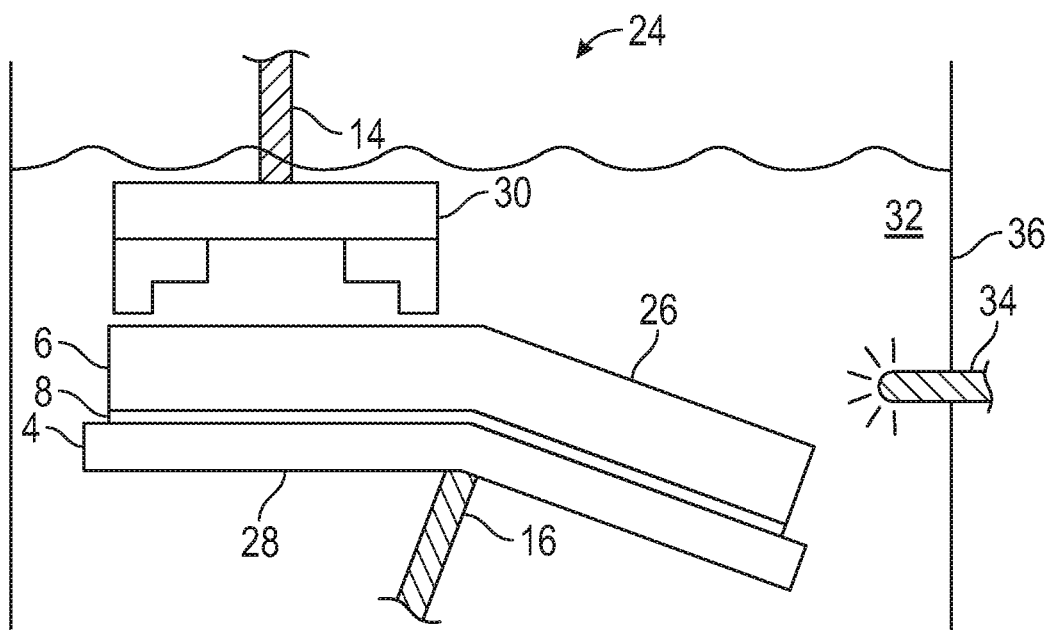
FIG. 2 is a side cross sectional view of a second implementation of a semiconductor substrate thinning system.

Referring to FIG. 2, a second implementation of a substrate thinning system 24 is illustrated. This system shows a substrate 26 similar to that of FIG. 1 coupled to a substrate chuck 28 placed for thinning below grinding wheel 30. In this implementation, water medium 32 covers the substrate 26 and ultrasonic energy source 34 is directly coupled with the water medium 32 through extending directly into the water medium. In this implementation, the water medium 32 conveys the ultrasonic energy to the substrate 26, substrate chuck 28, and those portions of the grinding wheel 30 that contact the water medium 32. As previously described, the ultrasonic energy acting on these components may assist with breakdown of the microscopic/bulk structure of the material of the substrate during the thinning process and/or the removal of the abraded material of the substrate. In implementations where the ultrasonic energy source 34 is coupled with the water medium 32, the components of the system may be submerged in the water medium during operation rather than having the water medium flowed/sprayed over them during operation as illustrated by the water medium being included in vessel 36.

Figure 3:
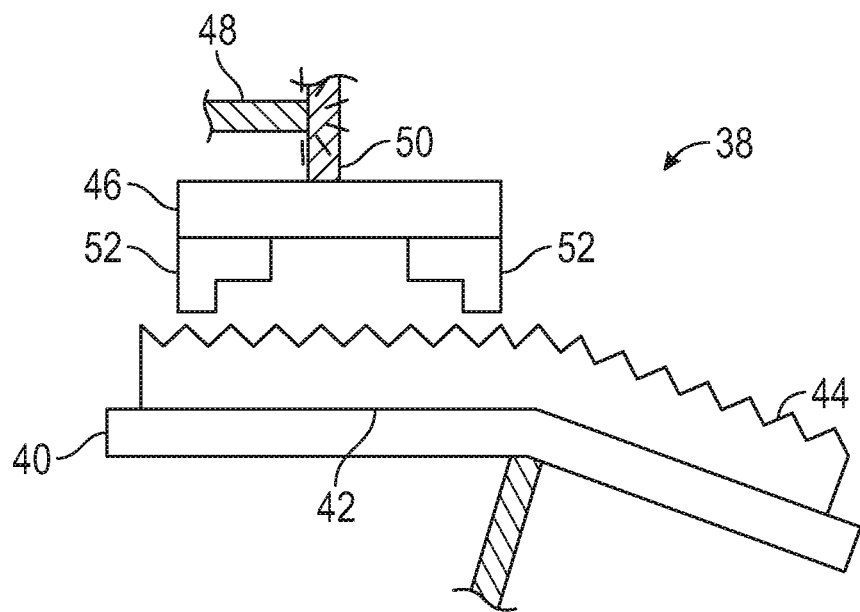
FIG. 3 is a side cross sectional view of a third implementation of a semiconductor substrate thinning system.

Referring to FIG. 3, a third implementation of a substrate thinning system 38 is illustrated. This implementation includes a substrate chuck 40 to which a wafer 42 is coupled. The wafer 42 has a roughened edge 44 that indicates pictorially that the wafer needs to be thinned/smoothed during the thinning process using the grinding wheel 46. As illustrated, an ultrasonic energy source 34 has been directly coupled with the spindle 50 that is coupled to the grinding wheel 46. The ultrasonic energy from the ultrasonic energy source 34 travels along the spindle 50 and is transferred to the grinding wheel 46 and its plurality of teeth 52. During the thinning process, the plurality of teeth 52 transfer the ultrasonic energy to the wafer 42, and by so doing the ultrasonic energy assists in breakdown of the material of the wafer 42 in the various ways previously discussed.

The wafer 42 illustrated in FIG. 3 is a single crystal silicon carbide wafer, and the roughened edge 44 is a diagram designed to show how such an SiC wafer, when separated using a laser damage process, demonstrates striations along the surface of the wafer. The striations are formed during the laser damage process through propagation of cracks in a c-plane of the substrate that runs at between a 1 degree to 6 degree angle (often 4 degrees) to the flat plane surface of the wafer coupled to the substrate chuck 42. These striations need to be removed from the wafer following separation. Also, since in some silicon carbide wafer formation processes, the thickness of the resulting silicon carbide wafer is thicker than needed for the devices due to fab processing requirements, the silicon carbide wafer may need to be thinned prior to processing to form the semiconductor devices or prior to packaging the semiconductor devices already formed.

For wafers that involve silicon carbide, since the hardness of silicon carbide is close to the hardness of the diamond material included in the teeth of the grinding wheel, the ability to accelerate the thinning rate of the silicon carbide wafer, and/or increase the lifetime of the grinding wheel (by lowering the wearing rate of the wheel) can result in significant cost savings. Also, increases in the thinning rate can result in faster run times per wafer, which can reduce the total quantity of thinning equipment needed to process a given number of silicon carbide wafers, further reducing cost of use of silicon carbide as a substrate for semiconductor wafer processing.

Figure 4:
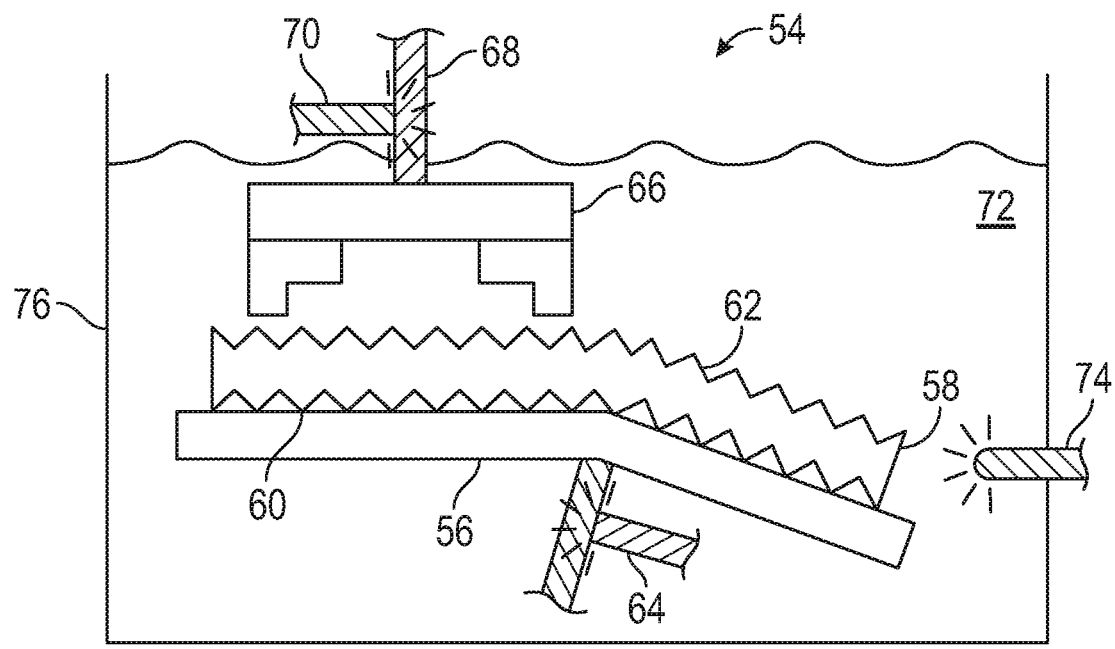
FIG. 4 is a side cross sectional view of a fourth implementation of a semiconductor substrate thinning system.

Referring to FIG. 4, a fourth implementation of a substrate thinning system 54 is illustrated. As illustrated, the system 54 includes a substrate chuck 56 to which a silicon carbide wafer 58 has been coupled. The silicon carbide wafer 58 has striations 60, 62 on both opposing surfaces of the wafer 58 as this wafer has not been polished after having been separated from the SiC boule and the boule surface was not polished before the wafer was formed. This figure illustrates how the substrate chuck 56 can be coupled with wafers which are not polished and flattened in various implementations to allow each side of the wafer to be polished through any of the various coupling mechanisms previously described. As illustrated, a first ultrasonic energy source 64 is coupled to the substrate chuck 56 and transfers ultrasonic energy to the substrate chuck and to the wafer 58. The grinding wheel 66 is positioned above the wafer 58 and is coupled to spindle 68. A second ultrasonic energy source 70 is coupled to the spindle 68 and transfers ultrasonic energy to the spindle 68 and to the grinding wheel 66. A water medium 72 surrounds the wafer 58 and at least portions of the grinding wheel 66 and/or the substrate chuck 56. A third ultrasonic energy source 74 is coupled with the water medium 72 and transmits ultrasonic energy to the wafer 58, the grinding wheel 66, and the substrate chuck 56 during the thinning process. In the implementation illustrated in FIG. 4, the use of all three ultrasonic energy sources 64, 70, 74 may all additively increase the thinning rate or may synergistically increase the thinning rate above each sources' additive rate due to enhancement of the breakdown rates of the microscopic/bulk material of the wafer 58 during operation. In this implementation, as in the implementation illustrate in FIG. 2, the static presence of the water medium 72 around the various components of the system is illustrated by the presence of vessel 76. However, in various implementations, the third ultrasonic energy source 74 may transmit the ultrasonic energy through flowing/spraying of the water medium 72 over the components of the system during operation.

In the various system implementations illustrated herein, the ultrasonic energy sources may take various forms, depending upon which component of the system they are coupled to (substrate chuck, spindle, or water medium). A wide variety of frequencies may be employed by the ultrasonic energy sources which may range from about 20 kHz to about 3 GHz. Where the sonic frequencies utilized by the ultrasonic energy source 40 are above 360 kHz, the energy source may also be referred to as a megasonic energy source (as used herein, ultrasonic is used to refer to both ultrasonic and megasonic frequencies for the purposes of easier discussion). In particular implementations, the ultrasonic energy source may generate ultrasonic vibrations at a frequency of 40 kHz at a power of 80 W. In various implementations, the ultrasonic energy source may apply a frequency of between about 30 kHz to about 50 kHz or about 35 kHz to about 45 kHz. However, in various implementations, frequencies higher than 50 kHz may be employed, including megasonic frequencies. A wide variety of power levels may also be employed in various implementations.

A wide variety of liquids could be employed to be in static or flowing contact with the various components of the system, such as, by non-limiting example, aqueous liquids, organic liquids, water, solvents, and any other liquid that exists as a liquid under the conditions within the bath. In various implementations, the form of the ultrasonic energy source may include a probe that extends into the wafer and which is vibrationally isolated from the vessel into which the probe extends so that the ultrasonic energy generated by the probe substantially transmits into the water medium and not into the material of the vessel itself. Multiple ultrasonic energy sources may be coupled to the liquid medium in various implementations. The ultrasonic energy source may employ a wide variety of transducer designs in various implementations, including, by non-limiting example, magnetostrictive transducers and piezoelectric transducers. In the case where a magnetostrictive transducer is utilized, the transducer utilizes a coiled wire to form an alternating magnetic field inducing mechanical vibrations at a desired frequency in a material that exhibits magnetostrictive properties, such as, by non-limiting example, nickel, cobalt, terbium, dysprosium, iron, silicon, bismuth, aluminum, oxygen, any alloy thereof, and any combination thereof. The mechanical vibrations are then transferred to the portion of the ultrasonic energy source that contacts the liquid (or spindle or other component of the system). Where a piezoelectric transducer is employed, a piezoelectric material is subjected to application of electric charge and the resulting vibrations are transferred to the portion of the ultrasonic energy source that contacts the liquid. Example of piezoelectric materials that may be employed in various implementations include, by non-limiting example, quartz, sucrose, topaz, tourmaline, lead titanate, barium titanate, lead zirconate titanate, and any other crystal or material that exhibits piezoelectric properties.

For ultrasonic energy sources that couple to the substrate chuck, the ultrasonic energy sources may be fastened to a lower surface of the chuck, embedded in the chuck, or fixedly attached to the side of the chuck opposite the side that contacts the substrate. Ultrasonic energy sources embedded in the chuck may be used where the substrate chuck rotates relative to the grinding wheel. Also, multiple ultrasonic energy sources may be coupled to the same chuck in various implementations to ensure the energy transmits evenly across the surface of the chuck.

For ultrasonic energy sources coupled with a spindle, the ultrasonic energy may transmitted using a sleeve and bearing coupled around the spindle in various implementations, or the ultrasonic energy source may transmit the energy to the entire spindle assembly (including the motor). In other implementations, the ultrasonic energy source may be coupled on an end of the spindle opposing the end coupled to the grinding wheel so that the energy can be transmitted up the shaft of the spindle. While ultrasonic energy sources could be coupled in the grinding wheel itself, since the grinding wheel is a consumable, coupling to the spindle may generally be the lower cost option. Multiple ultrasonic energy sources could be connected to the spindle in some implementations.

In places where the description above refers to particular implementations of wafer thinning systems and implementing components, sub-components, methods and sub-methods, it should be readily apparent that a number of modifications may be made without departing from the spirit thereof and that these implementations, implementing components, sub-components, methods and sub-methods may be applied to other wafer thinning systems.

What is claimed is:

1. A method of semiconductor substrate thinning, the method comprising:
    coupling a semiconductor substrate with a substrate chuck;
    coupling a grinding wheel with a spindle;
    contacting a water medium with the semiconductor substrate and with at least a portion of the substrate chuck and with at least a portion of the grinding wheel; and
    increasing a thinning rate of the semiconductor substrate by rotating one of the grinding wheel, the substrate chuck or both the grinding wheel and the substrate chuck while applying ultrasonic energy from an ultrasonic energy source to one of the substrate chuck, the spindle, the grinding wheel, the water medium, or any combination thereof.

2. The method of claim 1, further comprising thinning using one of:
    at least a second substrate chuck;
    at least a second spindle;
    at least a second ultrasonic energy source; or
    any combination thereof.

3. The system of claim 1, wherein the semiconductor substrate comprises silicon carbide.

4. The system of claim 1, wherein the grinding wheel comprises diamond.

5. The system of claim 1, wherein the ultrasonic energy source emits sonic energy between 20 kHz to 3 GHz.

6. A method of semiconductor substrate thinning, the method comprising:
    coupling a semiconductor substrate with a substrate chuck;
    coupling a grinding wheel with a spindle;
    contacting a water medium with the semiconductor substrate and with at least a portion of the substrate chuck and with at least a portion of the grinding wheel;
    while thinning the semiconductor substrate, decreasing a wearing rate of the grinding wheel through rotating one of the grinding wheel, the substrate chuck or both the grinding wheel and the substrate chuck while applying ultrasonic energy from an ultrasonic energy source to one of the substrate chuck, the spindle, the grinding wheel, the water medium, or any combination thereof.

7. The method of claim 6, further comprising using one of:
    at least a second substrate chuck;
    at least a second spindle;
    at least a second ultrasonic energy source; or
    any combination thereof.

8. The system of claim 6, wherein the semiconductor substrate comprises silicon carbide.

9. The system of claim 6, wherein the grinding wheel comprises diamond.

10. The system of claim 6, wherein the ultrasonic energy source emits sonic energy between 20 kHz to 3 GHz.

11. A method of semiconductor substrate thinning, the method comprising:
    providing a semiconductor substrate, a substrate chuck, a grinding wheel, and a spindle operatively coupled together;
    contacting a fluid with the semiconductor substrate and with at least a portion of the substrate chuck and with at least a portion of the grinding wheel; and
    increasing a thinning rate of the semiconductor substrate during thinning of the semiconductor substrate while applying ultrasonic energy from an ultrasonic energy source to one of the substrate chuck, the spindle, the grinding wheel, the fluid, or any combination thereof.

12. The method of claim 11, further comprising thinning using one of:
    at least a second substrate chuck;
    at least a second spindle;
    at least a second ultrasonic energy source; or
    any combination thereof.

13. The system of claim 11, wherein the semiconductor substrate comprises silicon carbide.

14. The system of claim 11, wherein the grinding wheel comprises diamond.

15. The system of claim 11, wherein the ultrasonic energy source emits sonic energy between 20 kHz to 3 GHz.

* * * * *